US00RE41681E

(19) United States
(12) Reissued Patent
Tyminski

(10) Patent Number: US RE41,681 E
(45) Date of Reissued Patent: Sep. 14, 2010

(54) ENHANCED ILLUMINATOR FOR USE IN PHOTOLITHOGRAPHIC SYSTEMS

(75) Inventor: Jacek K. Tyminski, Mountain View, CA (US)

(73) Assignee: Nikon Precision Inc., Belmont, CA (US)

(21) Appl. No.: 11/432,797

(22) Filed: May 12, 2006

Related U.S. Patent Documents

Reissue of:
(64) Patent No.: 6,842,223
Issued: Jan. 11, 2005
Appl. No.: 10/412,380
Filed: Apr. 11, 2003

(51) Int. Cl.
*G03B 27/42* (2006.01)
*G03B 27/54* (2006.01)
*G03B 27/72* (2006.01)
*G03F 1/00* (2006.01)

(52) U.S. Cl. ..... 355/53; 355/67; 355/71; 250/492.2; 425/130; 430/5

(58) Field of Classification Search ..... 355/67, 355/71, 53; 378/34, 35; 250/492.2; 430/5, 430/30; 425/130
See application file for complete search history.

(56) References Cited

U.S. PATENT DOCUMENTS 5,627,625 A 5/1997 Ogawa
5,631,721 A 5/1997 Stanton et al.
5,667,819 A * 9/1997 Eckardt ..... 425/130
5,675,401 A 10/1997 Wangler et al.
5,680,588 A 10/1997 Gortych et al.
5,926,257 A 7/1999 Mizouchi
6,025,938 A 2/2000 Kathman et al.
6,049,374 A 4/2000 Komatsuda et al.
6,084,655 A 7/2000 Suzuki et al.
6,128,068 A 10/2000 Suzuki et al.
6,233,039 B1 5/2001 Yen et al.
6,233,041 B1 5/2001 Shiraishi
6,259,512 B1 7/2001 Mizouchi
6,268,908 B1 7/2001 Bula et al.
6,271,909 B1 8/2001 Suzuki et al.

(Continued)

FOREIGN PATENT DOCUMENTS

EP 0 603 583 B1 6/1998
EP 0 946 894 B1 9/2000
EP 1 091 252 A2 4/2001
EP 1 170 635 A2 1/2002
EP 1 357 431 A2 10/2003
JP 11-2690708 9/1999
JP 2001-033875 2/2001
WO WO 02/05029 A1 1/2002

OTHER PUBLICATIONS

Tsai–Sheng Gau et al., "The Customized Illumination Aperture Filter for Low k1 Photolithography Process", Optical Microlithography XIII, Christoper J. Progler, Editor, Proceedings of SPIE vol. 4000 (2000), pp. 271–282.

(Continued)

*Primary Examiner*—Peter B Kim
(74) *Attorney, Agent, or Firm*—Jim Rose; Andrew M. Calderon; Roberts Mlotkowski Safran & Cole, P.C.

(57) ABSTRACT

Methods and apparatus for enabling both isolated and dense patterns to be accurately patterned onto a wafer are disclosed. According to one aspect of the present invention, an illumination system that is suitable for use as a part of a projection tool includes an illumination source and an illuminator aperture. The illuminator aperture has a center point and an outer edge, and also includes a first pole and a second pole. The first pole is defined substantially about the center point, and the second pole is defined substantially between the first pole and the outer edge of the first pole. The illumination source is arranged to provide a beam to the illuminator aperture.

69 Claims, 10 Drawing Sheets

U.S. PATENT DOCUMENTS

| | | | | |
|---|---|---|---|---|
| 6,285,443 | B1 | 9/2001 | Wangler et al. | |
| 6,388,736 | B1 | 5/2002 | Smith et al. | |
| 6,396,635 | B2 | 5/2002 | Kathman et al. | |
| 6,452,662 | B2 | 9/2002 | Mulkens et al. | |
| 6,455,862 | B1 * | 9/2002 | van der Veen et al. | 250/492.2 |
| 6,466,304 | B1 | 10/2002 | Smith | |
| 6,525,806 | B1 | 2/2003 | Smith | |
| 6,563,567 | B1 | 5/2003 | Komatsuda et al. | |
| 6,636,293 | B1 | 10/2003 | Shiraishi | |
| 6,654,101 | B2 | 11/2003 | Suzuki et al. | |
| 6,671,035 | B2 | 12/2003 | Eurlings et al. | |
| 6,704,092 | B2 | 3/2004 | Shiraishi | |
| 6,788,388 | B2 | 9/2004 | Smith | |
| 6,791,667 | B2 | 9/2004 | Smith | |
| 6,813,003 | B2 | 11/2004 | Oskotsky et al. | |
| 6,839,125 | B2 | 1/2005 | Hansen | |
| 6,855,486 | B1 | 2/2005 | Finders et al. | |
| 6,888,615 | B2 | 5/2005 | Tsacoyeanes et al. | |
| 6,897,944 | B2 | 5/2005 | Shiozawa | |
| 6,991,877 | B2 | 1/2006 | Saitoh et al. | |
| 7,233,887 | B2 * | 6/2007 | Smith | 703/2 |
| 2001/0001247 | A1 | 5/2001 | Finders et al. | |
| 2001/0007495 | A1 | 7/2001 | Suzuki et al. | |
| 2002/0109827 | A1 | 8/2002 | Nishi | |
| 2002/0126267 | A1 | 9/2002 | Smith | |
| 2002/0145720 | A1 | 10/2002 | Smith | |
| 2002/0152452 | A1 | 10/2002 | Socha | |
| 2002/0167653 | A1 * | 11/2002 | Mulkens et al. | 355/67 |
| 2002/0177048 | A1 | 11/2002 | Saitoh et al. | |
| 2003/0112421 | A1 | 6/2003 | Smith | |
| 2004/0080736 | A1 | 4/2004 | Suzuki et al. | |
| 2004/0156030 | A1 | 8/2004 | Hansen | |
| 2004/0158808 | A1 | 8/2004 | Hansen | |
| 2004/0248043 | A1 | 12/2004 | Shiraishi | |
| 2005/0018164 | A1 | 1/2005 | Hansen | |
| 2005/0186491 | A1 | 8/2005 | Hsu et al. | |
| 2005/0190355 | A1 | 9/2005 | Sewell | |
| 2006/0072095 | A1 | 4/2006 | Kudo et al. | |

OTHER PUBLICATIONS

Terence C. Barrett, "Impact of Illumination Pupil–fill Spatial Variation on Simulated Imaging Performance", Optical Microlithography XIII, Christopher J. Progler, Editor, Proceedings of SPIE vol. 4000 (2000), pp. 804–817.

Alan E. Rosenbluth et al., "Optimum Mask and Source Patterns to Print a Given Shape", Optical Microlithography XIV, Christopher J. Progler, Editor, Proceedings of SPIE vol. 4346 (2001), pp. 486–502.

Boudweijin Sluijk et al., "Performance Results of a New Generation of 300 mm Lithography Systems", Optical Microlithography XIV, Christopher J. Progler, Editor, Proceedings of SPIE vol. 4346 (2001), pp. 544–557.

Marc D. Himel et al., "Design and Fabrication of Customized Illumination Patterns for Low k1 Lithography: A Diffractive Approach", Optical Microlithography XIV, Christopher J. Progler, Editor, Proceedings, of SPIE vol. 4346 (2001), pp. 1436–1442.

Gek Soon Chua et al., "Sub–0.10 μm, Lithography Technology with Resolution Enhancement Technique", Optical Microlithography XV, Anthony Yen, Editor, Proceedings of SPIE vol. 4691 (2002), pp. 1563–1574.

Kenji Yamazoe et al., "A New Resolution Enhancement Method Realizing the Limit of Single Mask Exposure", Photomask and Next–Generation Lithography Mask Technology IX, Hiroichi Kawahira, Editor, Proceedings of SPIE vol. 4754 (2002), pp. 471–482.

Robert Socha et al., "Illumination Optimization of Periodic Patterns for Maximum Process Window", Microelectronic Engineering 61–62 (2002) 57–64, © 2002 Published by Elsevier Science B.V.

Scott Jessen et al., "Design Rule Considerations for 65–nm Node Contact Using Off Axis Illumination", Proc. SPIE vol. 5756, p. 274–284, Design and Process Integration for Microelectronic Manufacturing III; Lars W. Liebmann; Ed., May 2005 (Abstract only).

Itty Matthew et al., "Design Restrictions for Patterning with Off–axis Illumination", Proc. SPIE vol. 5754, p. 1574–1585, Optical Microlithography XVIII; Bruce W. Smith; Ed., May 2005 (Abstract only).

Takeaki Ebihara et al., "150–nm Dense/Isolated Contact Hole Study with Canon IDEAL Technique", Proc. SPIE vol. 4562, p. 1068–1076, 21st Annual BACUS Symposium on Photomask Technology; Giang T. Dao, Brian J. Grenon; Eds., Mar. 2002 (Abstract only).

J. F. Chen et al., "RET Masks for the Final Frontier of Optical Lithography", Proc. SPIE vol. 5853, p. 168–179, Photomask and Next–Generation Lithography Mask Technology XII; Masanori Komuro; Ed., Jun. 2005 (Abstract only).

Yuri Granik, "Illuminator Optimization Methods in Microlithography", Proc. SPIE vol. 5524, p. 217–229, Novel Optical Systems Design and Optimization VII; Jose M. Sasian, R. John Koshel, Paul K. Manhart, Richard C. Juergens; Eds., Oct. 2004 (Abstract only).

Guohong Zhang et al., "Illumination Source Mapping and Optimization with Resist–based Process Metrics for Low–$k_1$ Imaging", Proc. SPIE vol. 5377, p. 369–380, Optical Microlithography XVII; Bruce W. Smith; Ed. May 2004 (Abstract only).

* cited by examiner

ENHANCED ILLUMINATOR FOR USE IN PHOTOLITHOGRAPHIC SYSTEMS

Matter enclosed in heavy brackets [ ] appears in the original patent but forms no part of this reissue specification; matter printed in italics indicates the additions made by reissue.

BACKGROUND OF THE INVENTION

1. Field of Invention

The present invention relates generally to semiconductor processing equipment. More particularly, the present invention relates to an illuminator layout of a projection tool which enables both dense and isolated patterns on reticles to be precisely projected onto a wafer surface during a lithographic process.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, products formed using the precision instrument may be improperly formed and, hence, function improperly. For instance, a photolithography machine with an illuminator which does not allow circuit patterns or features associated with a reticle to be precisely projected onto a semiconductor wafer surface may result in the formation of integrated circuits or semiconductor chips which do function as expected.

FIG. 1 is a diagrammatic representation of a photolithography or exposure apparatus. An exposure apparatus 100 includes a reticle 104 which effectively serves as a mask or a negative for a wafer 108. Patterns, e.g., patterns formed using a thin metal layer or layers, which are resident on reticle 104 are projected as images onto wafer 108 when reticle 104 is positioned over wafer 108 in a desired position. An illuminator 112 is used to provide a broad beam of light to reticle 104. In other words, illuminator 112 distributes light. Portions of a light beam, for example, may be absorbed by reticle 104 while other portions pass through reticle 104 and are focused onto wafer 108 through lens assembly 116.

Wafer scanning stages (not shown) are generally used hold and to position wafer 108 such that portions of wafer 108 may be exposed as appropriate during masking process or an etching process. Reticle scanning stages (not shown) are generally used to hold reticle 104, and to position reticle 104 for exposure over wafer 108.

Illuminator 112 includes an illumination source 120 which provides a beam of light or a relatively broad beam of electrons. The beam provided by illumination source 120 illuminates illuminator aperture 124 which provides poles or areas through which the beam may pass. As will be discussed below, the pattern of poles provided by illuminator aperture 124 is typically dependent upon an anticipated type of patterning on reticle 104. Once a beam, or portions of the beam, passes through illuminator aperture 124, the beam is condensed by a condenser lens 128. Condenser lens 128 delivers the beams passing through illuminator aperture 124 to reticle 104 at a desired angle of incidence.

Reticle 104 may be patterned with an isolated geometry, a dense geometry, or a varied geometry. The type of patterning on reticle 104 is typically dependent upon a desired integrated circuit design to be patterned on wafer 108. When reticle 104 has a varied geometry, reticle 104 may include areas which are sparsely populated and areas which are densely populated. FIG. 2a is a diagrammatic representation of a reticle with an isolated pattern geometry, i.e., a reticle which is relatively sparsely populated. A reticle 200 includes patterned features or contacts 204 which may have at least one dimension 'd1' 208 that is a critical dimension. As will be appreciated by those skilled in the art, contacts 204 are generally open segments or print holes in reticle 200.

Typically, dimension 'd1' 208 is in the range of approximately one micron or less. More generally, the critical dimensions including dimension 'd1' 208 are in a range from approximately a fraction of an illumination wavelength to approximately a relatively low multiple of the illumination wavelength. When reticle 200 is considered to have an isolated geometry, then adjacent contacts 204 are typically spaced at distances of approximately a few times dimension 'd1' 208, or a relatively low multiple of dimension 'd1' 208. As shown, contact 204a is spaced apart from contact 204b by a distance 'd2' 212 which is generally substantially more than the distance associated with dimension 'd1' 208.

FIG. 2b is a diagrammatic representation of a reticle with a dense pattern geometry. A reticle 220 includes features or contacts 224 which have at least one dimension 'd1' 228 that is defined as a critical dimension. When reticle 220 is densely patterned, contacts 224 are typically spaced apart such that a distance 'd2' 232 between adjacent contacts 224a, 224b is less than or approximately equal to the critical dimension, e.g., dimension 'd1' 228.

The configuration of an illuminator aperture that is used in an illuminator which provides a beam, e.g., a beam of light, to a reticle is generally dependent upon the pattern of features or contacts on the reticle. In other words, an illuminator aperture is typically chosen based upon the requirements of a reticle which is to be used with the illuminator aperture. The layout of an illuminator aperture effectively defines the directions at which features on a reticle are illuminated. In addition, the layout or configuration of an illuminator aperture also defines the direction or directions in which light scatters from a reticle.

Typically, the configuration of an illuminator aperture that is to be used with a reticle which has an isolated or sparse pattern geometry varies from the configuration of an illuminator aperture that is to be used with a reticle which has a dense pattern geometry. [Since the illuminator aperture serves as an attenuated phase shift mask, different] *Different* illumination requirements are associated with the patterning of isolated and dense geometries. When a reticle has an isolated pattern geometry, a small sigma, on-axis illuminator aperture is used to meet illumination requirements for patterning isolated pattern images onto a wafer. Alternatively, an off-axis illuminator aperture is used to meet illumination requirements for patterning dense pattern images onto a wafer.

With reference to FIG. 3, a small sigma, on-axis illuminator aperture will be described. An illuminator aperture 300 includes a pole 304, e.g., an opening, that is positioned substantially in the center to illuminator aperture 300. Pole 304 is arranged to allow a beam such as a beam of light to pass therethrough to a reticle (not shown). Illuminator aperture 300 is configured to substantially optimize the patterning of isolated features onto a wafer (not shown). While the configuration of illuminator aperture 300 is effective for use in accurately patterning isolated features, the configuration of illuminator aperture 300 is generally relatively poor with respect to the accurate patterning of dense features.

As previously mentioned, when dense features are to be patterned, an off-axis illuminator aperture is typically used. FIGS. 4a and 4b are diagrammatic representations of off-axis illuminator apertures with substantially circular poles. A first off-axis illuminator aperture 400 with substantially circular poles 404 is arranged with four poles 404 in a square pattern, as shown in FIG. 4a. The arrangement of poles 404 generally enables precise patterning of dense features. However, the arrangement of poles 404 does not allow for the precise patterning of isolated features. Poles 414 of illuminator aperture 410, as shown in FIG. 4b, are positioned in a diamond pattern. Like poles 404 of illuminator aperture 400, the positioning of poles 414 of illuminator aperture 410 is substantially optimized for the patterning of dense features. When the positioning of poles 414 is substantially optimized for the patterning of dense features, illuminator aperture 410 does not allow for the accurate patterning of isolated features.

In lieu of having substantially circular poles, an off-axis illuminator aperture may have poles of other shapes. By way of example, poles may have substantially triangular shaped poles. FIGS. 5a and 5b are diagrammatic representations of off-axis illuminator apertures which have substantially triangular shaped poles. An illuminator aperture 500 includes substantially triangular poles 504 which are arranged in a square pattern, as shown in FIG. 5a. Substantially triangular poles 514 which are included on an illuminator aperture 510 of FIG. 5b are arranged in a diamond pattern. While both the square pattern and the diamond pattern of poles 504 and poles 514, respectively, are effective for optimizing the patterning of isolated features, neither pattern allows for the precise patterning of dense features.

When an illuminator aperture allows isolated features to be accurately patterned, the illuminator aperture patterns dense features relatively poorly. That is, when an illuminator aperture provides relatively good dimensional control of isolated feature images on a wafer, the illuminator aperture generally does not provide good dimensional control for dense feature images on a wafer. Similarly, when an illuminator aperture allows dense features to be accurately patterned, the illuminator aperture patterns isolated features relatively poorly.

Often, semiconductor wafers require areas which require isolated patterning and areas which require dense patterning. In other words, many wafers have areas which will have isolated feature images and areas which have dense feature images. Reticles that are used to pattern both isolated feature images and dense feature images on a wafer will also portions which have isolated features and portions which have dense features. When reticles include both isolated features and dense features, then the use of an illuminator aperture which is good for patterning the isolated features is not as good for patterning the dense features. Alternatively, the use of an illuminator aperture which is good for patterning the dense features is not as good for patterning the isolated features. As such, it is generally necessary to sacrifice the precise dimensional control of some feature images for the precise dimensional control of other feature images.

Sacrificing the dimensional control or the accuracy with which feature images, i.e., either isolated feature images or dense feature images, are patterned onto a wafer may cause the quality of semiconductor chips formed from the wafer to suffer. As such, when a wafer has both an isolated pattern geometry and a dense pattern geometry, the choice of either a small sigma, on-axis illuminator aperture or an off-axis illuminator aperture to use in patterning the wafer will result in the sacrifice of the accuracy with which either dense feature images or isolated feature images, respectively, are patterned onto the wafer. When some features on a wafer are inaccurately formed, the functionality, e.g., the performance, of semiconductor chips included on the wafer may be unacceptable.

Therefore, what is needed is a system and a method which enables both isolated pattern geometries and dense pattern geometries to be relatively accurately formed on a wafer. More specifically, what is desired is an illuminator aperture which enables good dimensional control of both isolated pattern images and dense pattern images formed on a wafer.

SUMMARY OF THE INVENTION

The present invention relates to a method and an apparatus for enabling both isolated and dense patterns to be accurately patterned onto a wafer. According to one aspect of the present invention, an illumination system that is suitable for use as a part of a projection tool includes an illumination source and an illuminator aperture. The illuminator aperture has a center point and an outer edge, and also includes a first pole and a second pole. The first pole is defined substantially about the center point, and the second pole is defined substantially between the first pole and the outer edge of the first pole. The illumination source is arranged to provide a beam to the illuminator aperture. In one embodiment, the second pole has an edge that is substantially coincident with the outer edge of the illuminator aperture.

An illuminator or, more specifically, an illuminator aperture, which includes a center pole and at least one outer pole allows the different requirements associated with patterning isolated features and dense features of an integrated circuit design using an attenuated phase shift mask to be substantially addressed using a single illuminator aperture. That is, features of both a small sigma, on-axis illuminator aperture and an off-axis illuminator aperture may be incorporated into a single illuminator aperture such that neither the patterning of isolated features nor the patterning of dense features is significantly sacrificed for the other.

According to another aspect of the present invention, an illuminator aperture that is suitable for use as a component of an illumination system that is a part of a projection tool includes a center pole and a plurality of outer poles. The center pole is located about a center point of the illuminator aperture, and each outer pole is located between the center pole and an outer edge of the illuminator aperture. In one embodiment, the center pole has a first area and each outer pole has a second area that is effectively the same as the second area. In another embodiment, the center pole has an area that is approximately equal to the sum of the areas of all outer poles.

In accordance with still another aspect of the present invention, a photolithography apparatus includes an object, a reticle, and an illuminator. The reticle has a plurality of patterns that is to be patterned onto the object, and the illuminator has an illumination source and an illuminator aperture. The illumination source projects a beam through the illuminator aperture to the reticle. The illuminator aperture has a layout that includes an on-axis element and at least one off-axis element. In one embodiment, the plurality of patterns includes isolated patterns and dense patterns, and the layout of the illuminator aperture allows both the isolated patterns and the dense patterns to be patterned onto the object.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

The accuracy with which feature images, i.e., either isolated feature images or dense feature images, are patterned onto a wafer is typically crucial, since inaccurately formed images may adversely affect the performance of semiconductor chips formed from the wafer. When a small sigma, on-axis illuminator aperture is used to optimize the patterning of isolated features on a wafer which is to be patterned with both isolated features and dense features, the accuracy with which dense features may be formed is effectively sacrificed. Conversely, when an off-axis illuminator aperture is used to optimize the patterning of dense features on such a wafer, the accuracy with which isolated features may be formed is effectively sacrificed.

An illuminator aperture which has a layout that is conducive to both the patterning of isolated feature geometries and the patterning of dense feature geometries allows each of the geometries to be patterned substantially without sacrificing the other geometries. Creating an overall illuminator aperture which effectively combines a small sigma, on-axis illuminator aperture with an off-axis illuminator aperture effectively enables both isolated features and dense features to be relatively accurately patterned. Hence, the dimensional control of patterns including both isolated features and dense features may be enhanced. By controlling the sizes of poles as well as the location of poles in an illuminator aperture, the precision with which features may be formed on a wafer may be substantially optimized such that both isolated features and dense features are relatively accurately patterned.

Figure 1:
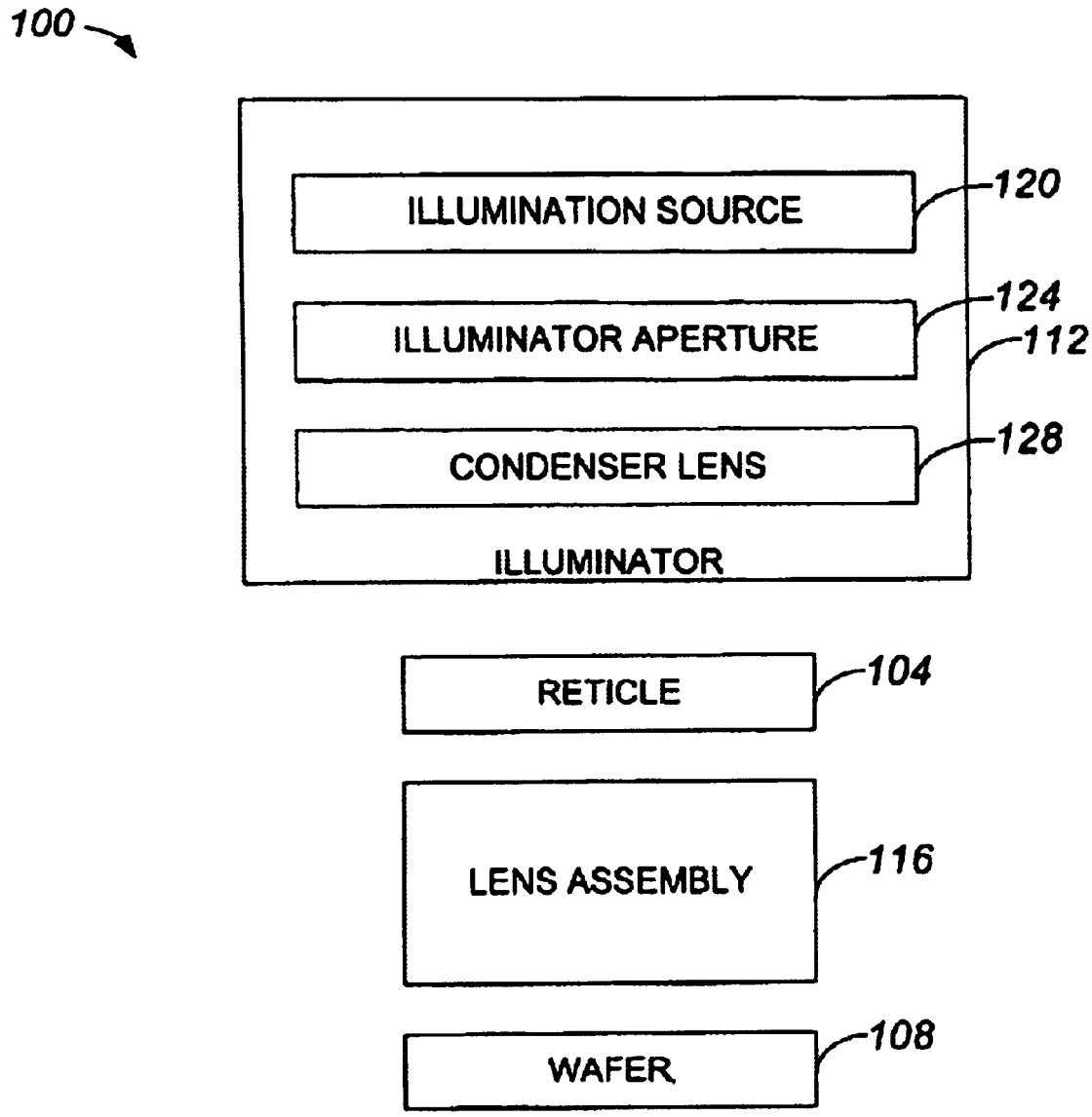
FIG. 1 is a diagrammatic block diagram representation of a lithography apparatus.
Figure 2A:
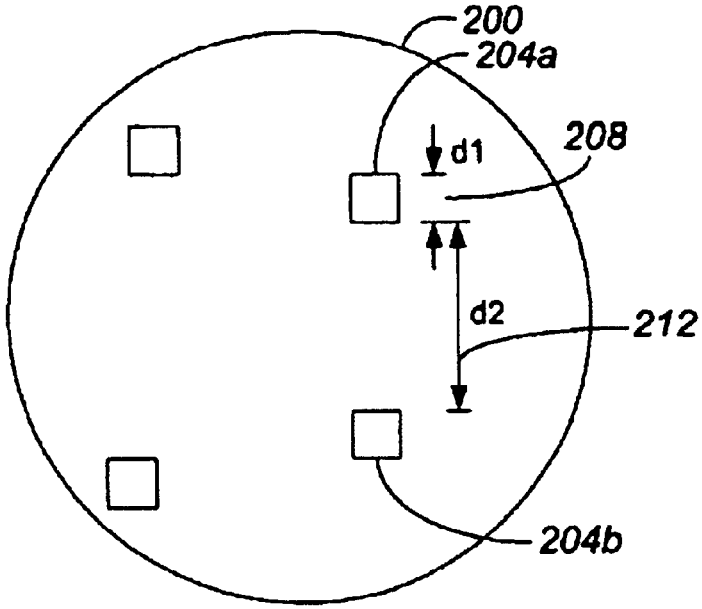
FIG. 2a is a diagrammatic representation of a reticle with isolated features.
Figure 2B:
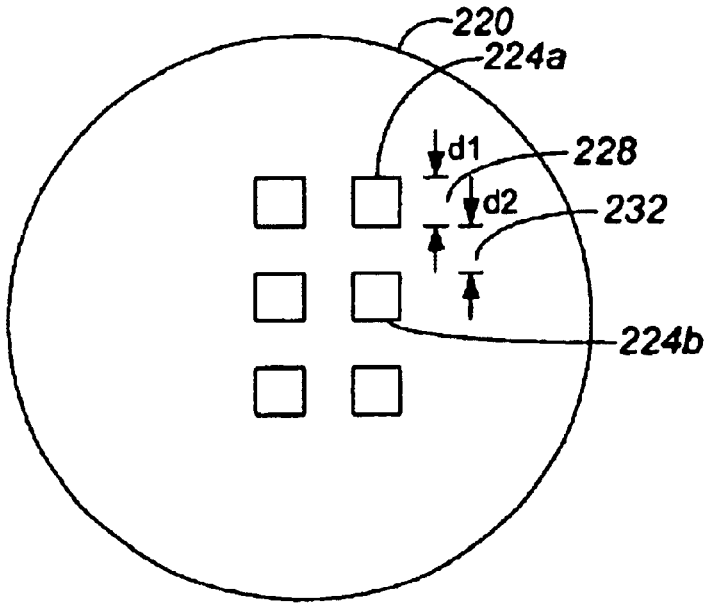
FIG. 2b is a diagrammatic representation of a reticle with dense features.
Figure 3:
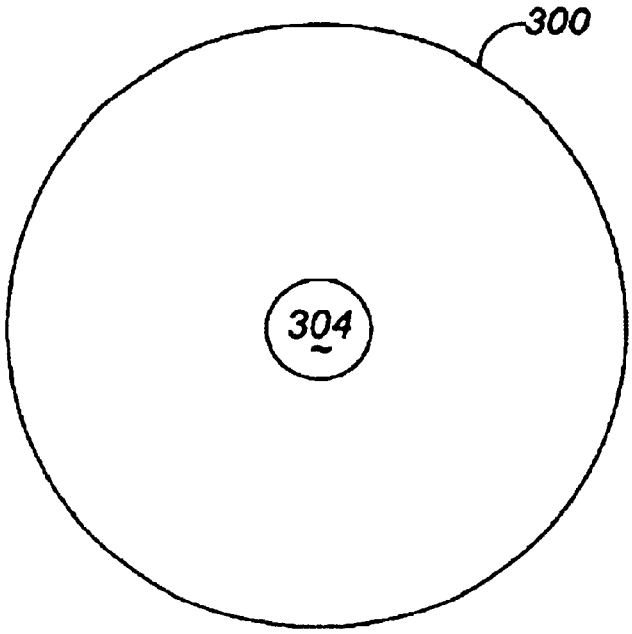
FIG. 3 is a diagrammatic representation of an illuminator aperture which is suitable for use with a reticle which has isolated features.
Figure 4A:
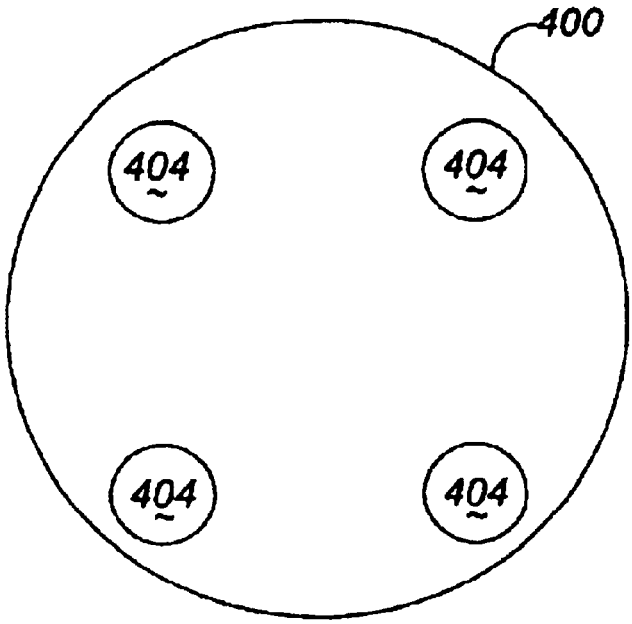
FIG. 4a is a diagrammatic representation of one illuminator aperture which is suitable for use with a reticle which has dense features.
Figure 4B:
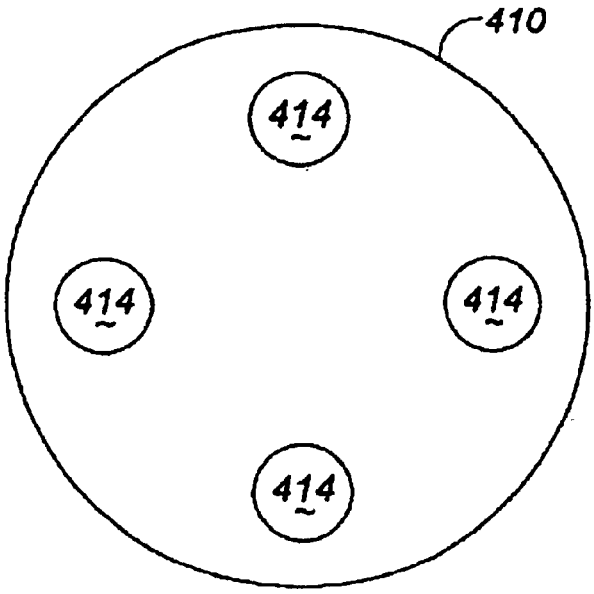
FIG. 4b is a diagrammatic representation of a second illuminator aperture which is suitable for use with a reticle which has dense features.
Figure 5A:
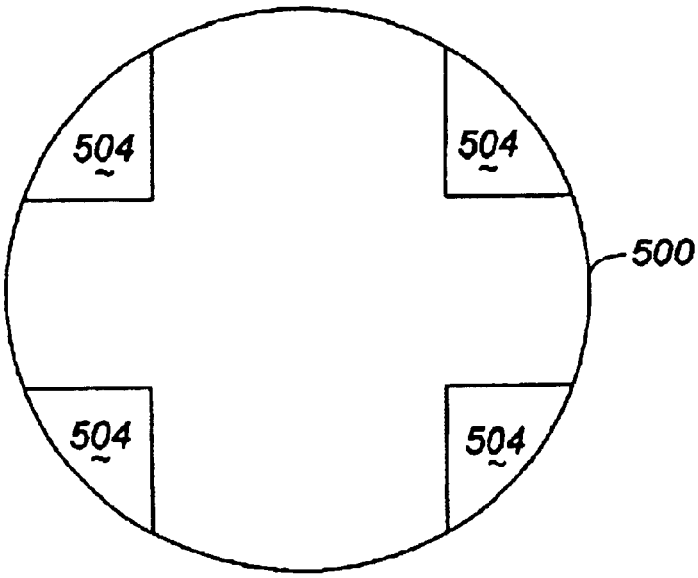
FIG. 5a is a diagrammatic representation of a third illuminator aperture which is suitable for use with a reticle which has dense features.
Figure 5B:
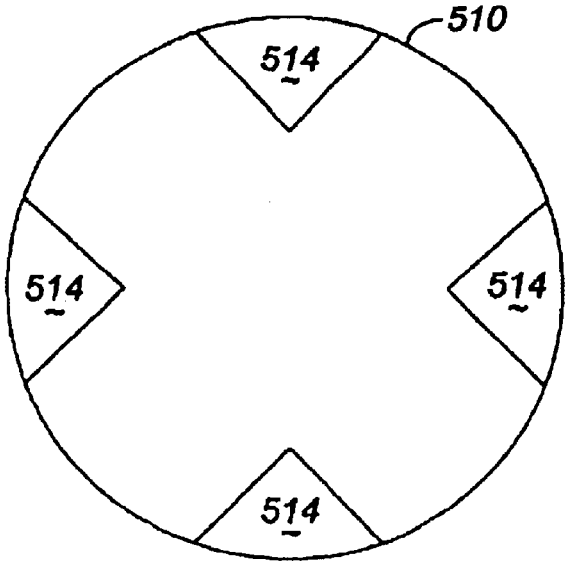
FIG. 5b is a diagrammatic representation of a fourth illuminator aperture which is suitable for use with a reticle which has dense features.
Figure 6:
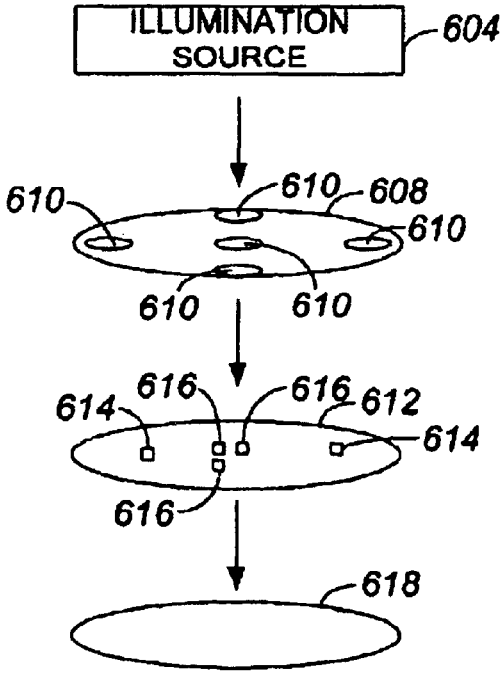
FIG. 6 is a diagrammatic representation of a projection process for using an enhanced illuminator aperture with a reticle which has both isolated and dense features to pattern a wafer in accordance with an embodiment of the present invention.

With reference to FIG. 6, the use of an overall illuminator aperture which effectively combines components of a small sigma, on-axis illuminator aperture with components of an off-axis illuminator aperture will be described in accordance with an embodiment of the present invention. An illumination source 604, e.g., a source of light or a source of electrons (*illumination intensity*), provides a beam to an illuminator aperture 608. It should be appreciated that the beam provided by illumination source 604 may generally be a beam of light. Illuminator aperture 608 includes poles 610 that are arranged in a layout which encompasses both a layout for a small sigma, on-axis illuminator aperture and a layout for an off-axis illuminator aperture. As such, the use of illuminator aperture 608 allows for good patterning of dense features substantially without significantly adversely affecting the patterning of isolated features, and vice versa.

Once the beam passes through illuminator aperture 608, the beam is provided to a reticle 612 which is patterned with both isolated features 614 and dense features 616. It should be appreciated that although the beam may be provided to reticle 612 through a condenser lens, a condenser lens has not been shown for ease of illustration. Poles 610 are arranged such that the illumination provided to reticle 612 is relatively good for both isolated features 614 and dense features 616. As a result, when features 614, 616 are projected onto a wafer 618, the dimensions associated with features 614, 616 as patterned onto wafer 618 are substantially as expected. In other words, since illuminator aperture 608 includes poles 610 which are positioned as appropriate for both a small sigma, on-axis layout and an off-axis layout, the dimensional control of feature images (not shown) on wafer 618 is relatively precise for both isolated features 614 and dense features 616.

Illuminator aperture 608 may take on a variety of different configurations in that the number of poles 610, as well as the shape of poles 610 may vary. The location of poles 610 may also vary. Generally, however, since illuminator aperture 608 is substantially a combination of a small sigma, on-axis illuminator aperture and an off-axis illuminator aperture, illuminator aperture 608 includes a pole 610 that is approximately in the center of illuminator aperture 608, as well as at least one pole 610 that is located between the approximate center and the outer edge of illuminator aperture 608. In one embodiment, the number of poles 610 may be three, e.g., for a 3-pole illuminator aperture, or five, e.g., for a 1–4-pole illuminator aperture or a 5-pole illuminator aperture.

Figure 7A:
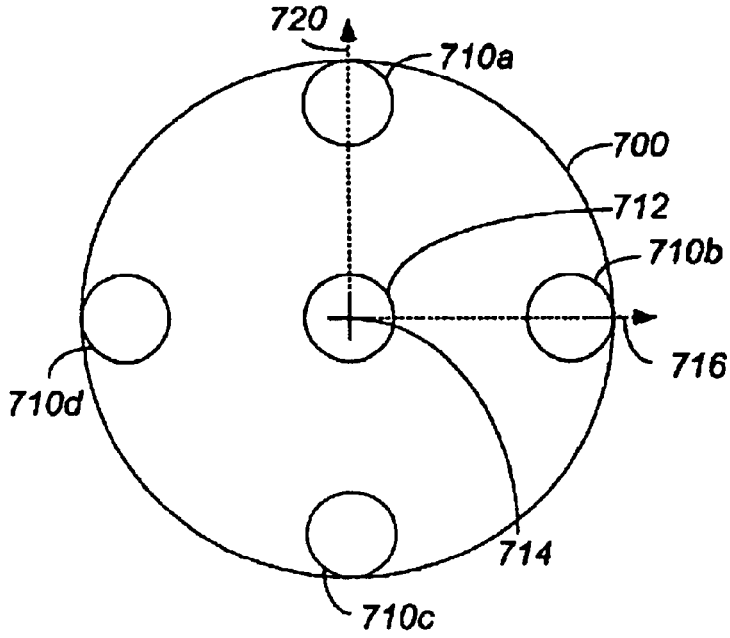
FIG. 7a is a diagrammatic representation of a straight 5-pole off-axis illuminator aperture in accordance with an embodiment of the present invention.

Referring next to FIG. 7a, one configuration of a 5-pole illuminator aperture will be described in accordance with an embodiment of the present invention. A 5-pole illuminator aperture 700 includes outer poles 710a–d and a center pole 712. As shown, poles 710a–d and center pole 712 have approximately the same sigma (σ) and approximately the same area. Pole 712, which is arranged to facilitate the patterning of isolated features, is located substantially at or about a center point 714 of illuminator aperture 700 and is a small sigma, on-axis pole. Poles 710a–d, which are arranged to facilitate the patterning of dense features are located along axes 716, 720 which meet at center point 714. In other words, poles 710a–d are each in line with an appropriate axis 716, 720. In the described embodiment, poles 710a–d each have an area that is substantially equal to the area of pole 712. Additionally, poles 710a–d are such that each pole 710a–d has an outer edge that substantially coincides with the outer edge of illuminator aperture 700. By either or both substantially optimizing sigma (σ) for poles 710a–d and substantially optimizing the distance between center point 714 and poles 710a–d, the exposure latitude associated with illuminator aperture 700 may be improved.

Illuminator aperture 700 may be considered to be a "straight" off-axis 5-pole illuminator aperture in that poles 710a–d are each in line with an appropriate axis 716, 720. The location of poles 710a–d relative to pole 712 and the outer edge of illuminator aperture 700 may be chosen, e.g., substantially optimized, to provide good patterning of both isolated features and dense features imaged using illuminator aperture 700 during a process such as an integrated circuit manufacturing process.

Figure 7B:
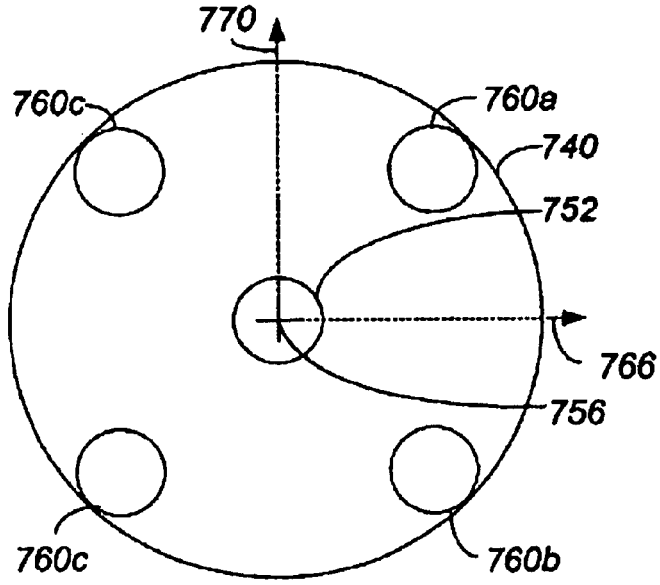
FIG. 7b is a diagrammatic representation of a diagonal 5-pole off-axis illuminator aperture in accordance with an embodiment of the present invention.

While poles 710a–d are in a straight off-axis alignment, poles 710a–d may instead be in a "diagonal" off-axis alignment. FIG. 7b is a diagrammatic representation of a diagonal 5-pole off-axis illuminator aperture in accordance with an embodiment of the present invention. A 5-pole illuminator aperture 740 includes outer poles 760a–d and a center pole 712. Poles 760a–d are in a substantially diagonal layout with respect to axes 766, 770 in that none of poles 760a–d are aligned along axes 766, 770. The location of poles 760a–d is such that poles 760a–d are located between a center 756 of illuminator aperture 740 and an outer periphery of illuminator aperture 740. Pole 752 is located substantially at or about center 756 of illuminator aperture 740. As shown, each of poles 760a–d and pole 752 have substantially the same area.

When the layout of an illuminator aperture used as a part of an overall illuminator is optimized to provide the best possible patterning of both isolated and dense pattern geometries, in addition to changing the locations of poles of the illuminator aperture, the sizes of the poles may also be changed. For instance, the area of a center pole, e.g., center pole 712 of FIG. 7a, may be changed to allow the patterning of isolated features to be improved substantially without significantly affecting the patterning of dense features. Typically, by changing the ratio of the area of a center pole relative to the area of an outer pole, the patterning quality of both isolated and dense pattern geometries may be altered.

Figure 8A:
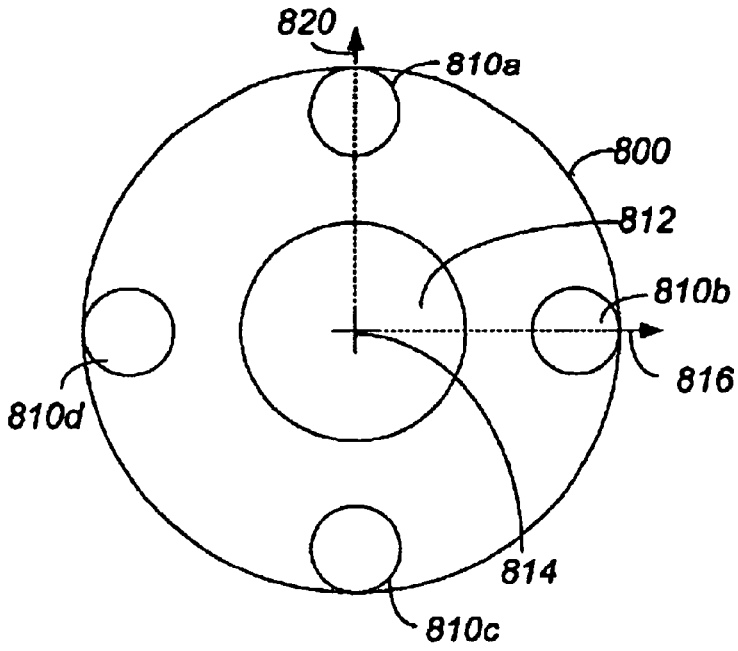
FIG. 8a is a diagrammatic representation of a 1–4-pole straight off-axis illuminator aperture in accordance with an embodiment of the present invention.

An illuminator aperture in which a center pole has a greater area than outer poles may be considered to be a 1–4-pole illuminator aperture when there are four outer poles on the illuminator aperture. FIG. 8a is a diagrammatic representation of a straight, 1–4-pole illuminator aperture in accordance with an embodiment of the present invention. A 1–4-pole illuminator aperture 800 includes a center pole 812 and four outer poles 810a–d. Center pole 812 is positioned at or about a center 814 of illuminator aperture 800, while outer poles 810a–d are positioned between center pole 812 and an outer edge of illuminator aperture 800. As shown, edges of outer poles 810a–d substantially coincide with the outer edge of illuminator aperture 800.

In one embodiment, when design considerations are such that substantially equal illumination power is to be provided to both isolated and dense geometries, the area of center pole 812 may be approximately equal to the combined areas of poles 810a–d. That is, in order to spread power relatively evenly with respect to different pattern geometries, the area of center pole 812 may be approximately equal to four times the area of one of poles 810a–d. When the proportions between the area of center pole 812 is increased relative to the area of off-axis poles 810a–d, i.e., when the area of center pole 812 is larger than the area of each pole 810a–d, then isolated contact hole image formation may be enhanced. On the other hand, when the proportions between the area of center pole 812 is decreased relative to the area of poles 810a–d, dense feature image formation may be enhanced substantially at the expense of the isolated feature images.

Figure 8B:
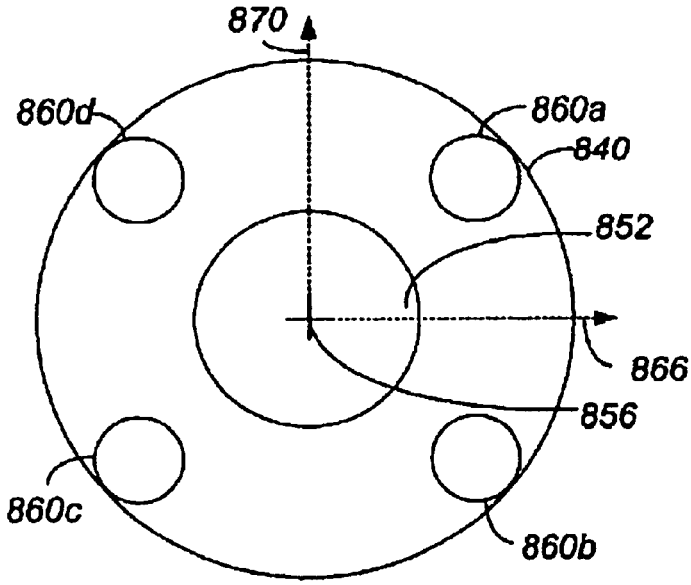
FIG. 8b is a diagrammatic representation of a 1–4-pole diagonal off-axis illuminator aperture in accordance with an embodiment of the present invention.

Poles 810a–d are in a straight, off-axis alignment that poles 810a–d are aligned along axes 816, 820. It should be appreciated that outer poles in a 1–4-pole illuminator aperture may also be in a diagonal, off-axis alignment. With reference to FIG. 8b, a 1–4-pole illuminator aperture in which outer poles are configured in a diagonal orientation will be described in accordance with an embodiment of the present invention. An illuminator aperture 840 includes a center pole 852 which is substantially centered about a center point 856, and outer poles 860a–d. Center pole 852 has a larger sigma (σ) than each of outer poles 860a–d, and may be sized, in one embodiment, such that the area of center pole 852 is substantially equal to the sum of the areas of outer poles 860a–d.

Outer poles 860a–d are positioned such that an outer edge of each pole 860a–d effectively coincides with an outer edge of illuminator aperture 840. The orientation of poles 860a–d is such that poles 860a–d are offset from axes 866, 870. As shown, poles 860a–d effectively diagonally offset from axes 866, 870 such that poles 860a–d form a square pattern on illuminator aperture 866, 870.

Generally, the use of either a 5-pole illuminator aperture or a 1–4-pole illuminator aperture is particularly suitable for a two-dimensional erase of contact geometries which may include either or both dense feature patterns and isolated feature patterns. It should be appreciated that a two-dimensional pattern layout typically occurs when features have two critical dimensions and are placed in two directions. The two critical dimensions as well as the separation between the features in two directions may vary. As such, to reflect such a variance, the location and the shape of poles in an illuminator aperture may be adjusted as needed. While a 5-pole illuminator aperture or a 1–4-pole illuminator aperture are also suitable for use for other types of overall geometries which include either or both dens feature patterns and isolated feature patterns, some geometries may be better suited for use with a 3-pole illuminator aperture or a 1–2 pole illuminator aperture. By way of example, for one dimensional line space geometries, the use of an illuminator aperture which includes one center pole and two outer poles may result in better performance than an illuminator aperture which includes one center pole and four outer poles.

Figure 9A:
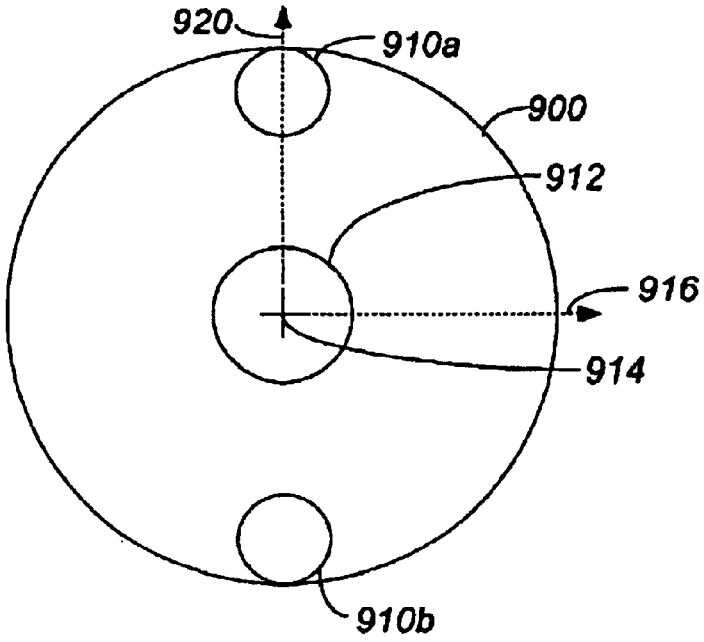
FIG. 9a is a diagrammatic representation of a straight, off-axis 1–2-pole illuminator aperture in accordance with an embodiment of the present invention.

FIG. 9a is a diagrammatic representation of an illuminator aperture which includes a center pole and two outer poles in accordance with an embodiment of the present invention. An illuminator aperture 900 includes a center pole 912 that is substantially centered about a center point 914 of illuminator aperture 900, and outer poles 910a, 910b which are positioned between center point 914 and an outer edge of illuminator aperture 900. Outer poles 910a, 910b, which are positioned such that an outer edge of each pole 910a, 910b coincides with an outer edge of illuminator aperture 900.

Poles 910a, 910b are aligned along axes 916, 920. Specifically, in the described embodiment, poles 910a, 910b are aligned along axis 920. As such, illuminator aperture 900 is a straight illuminator aperture. It should be appreciated that the location of poles 910a, 910b may vary. By way of example, poles 910a, 910b may be oriented in a diagonal configuration.

Figure 9B:
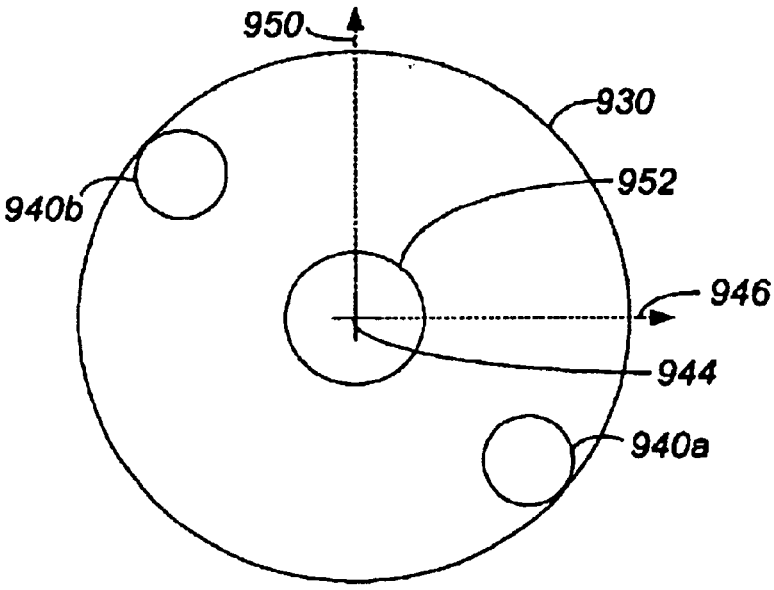
FIG. 9b is a diagrammatic representation of a diagonal, off-axis 1–2-pole illuminator aperture in accordance with an embodiment of the present invention.

As shown, center pole 912 has an area that is approximately equal to the sum of the areas of poles 910a, 910b. Hence, illuminator aperture 900 may be considered to be a 1–2-pole illuminator aperture. When center pole 912 has an area that is approximately equal to the area of one pole 910a, 910b, illuminator aperture 900 may generally be considered to be a 3-pole illuminator aperture. FIG. 9b is a diagrammatic representation of an illuminator aperture which includes a center pole and two outer poles which are in a substantially diagonal orientation in accordance with an embodiment of the present invention. An illuminator aperture 930 includes a center pole 952 positioned about a center point 944 of illuminator aperture 930 and outer poles 940a, 940b which are offset from axes 946, 950. Since outer poles 940a, 940b are substantially diagonally displaced relative to axes 946, 960, illuminator aperture 930 is a diagonal, off-axis illuminator aperture.

Figure 10:
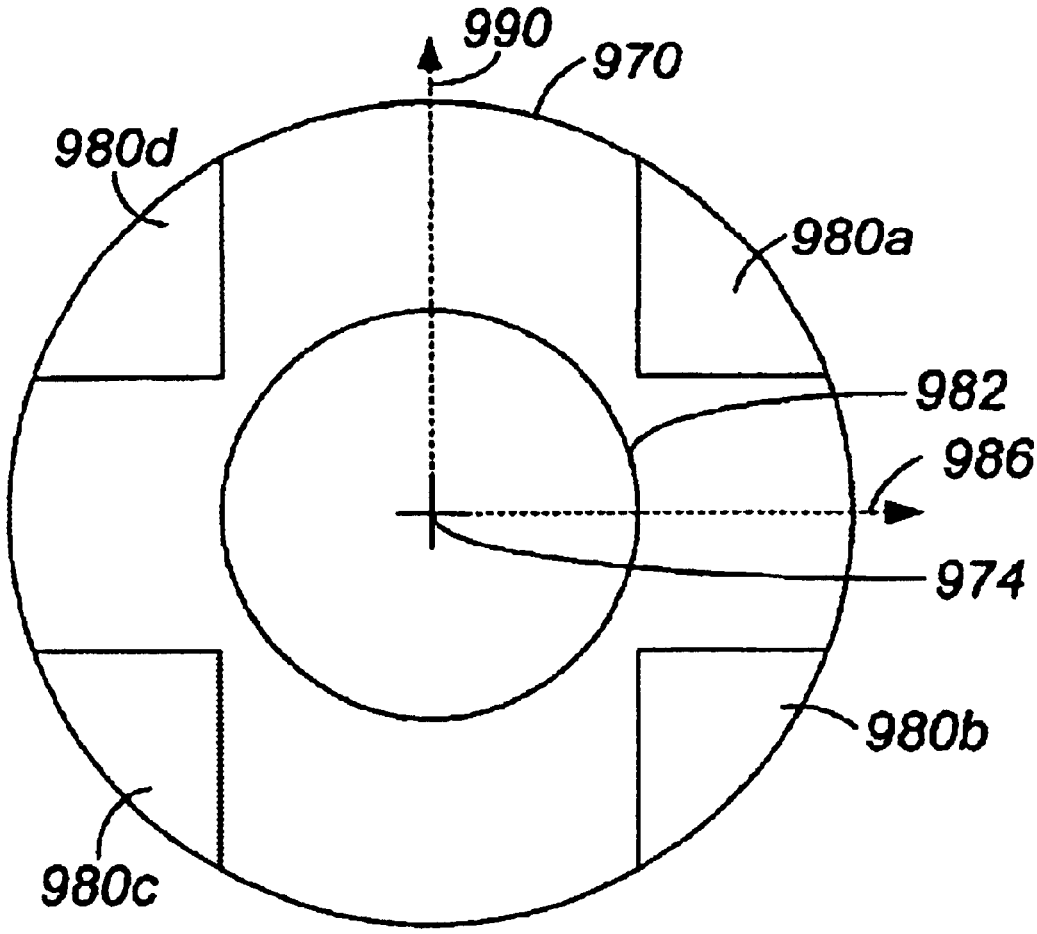
FIG. 10 is a diagrammatic representation of a straight 5-pole off-axis illuminator aperture in accordance with another embodiment of the present invention.

Poles on an illuminator aperture may vary in size and location, as previously mentioned. Poles may also vary in shape, i.e., poles are not necessarily circular in shape. The shapes of poles, for example, may vary depending upon the requirements of a particular system. In some instances, substantially triangular or rectangular shaped outer or center poles may be preferred over circular shaped outer or center poles. Referring next to FIG. 10, an illuminator aperture which includes outer poles that are substantially triangular shaped will be described in accordance with an embodiment of the present invention. A 1–4 pole illuminator aperture 970 includes a center pole 982 that is positioned about a center point 974. Illuminator aperture 970 also includes outer poles 980a–d which are positioned between center point 974 and an outer edge of illuminator aperture 970 such that edges of outer poles 980a–d are substantially coincident with the outer edge. In the described embodiment, poles 980a–d are substantially triangular shaped, and are offset from axes 986, 990. Additionally, the area of center pole 982 is approximately equal to the combined areas of poles 980a–d. Hence, illuminator aperture 970 is a diagonal, off-axis 1–4 pole illuminator aperture.

Figure 11:
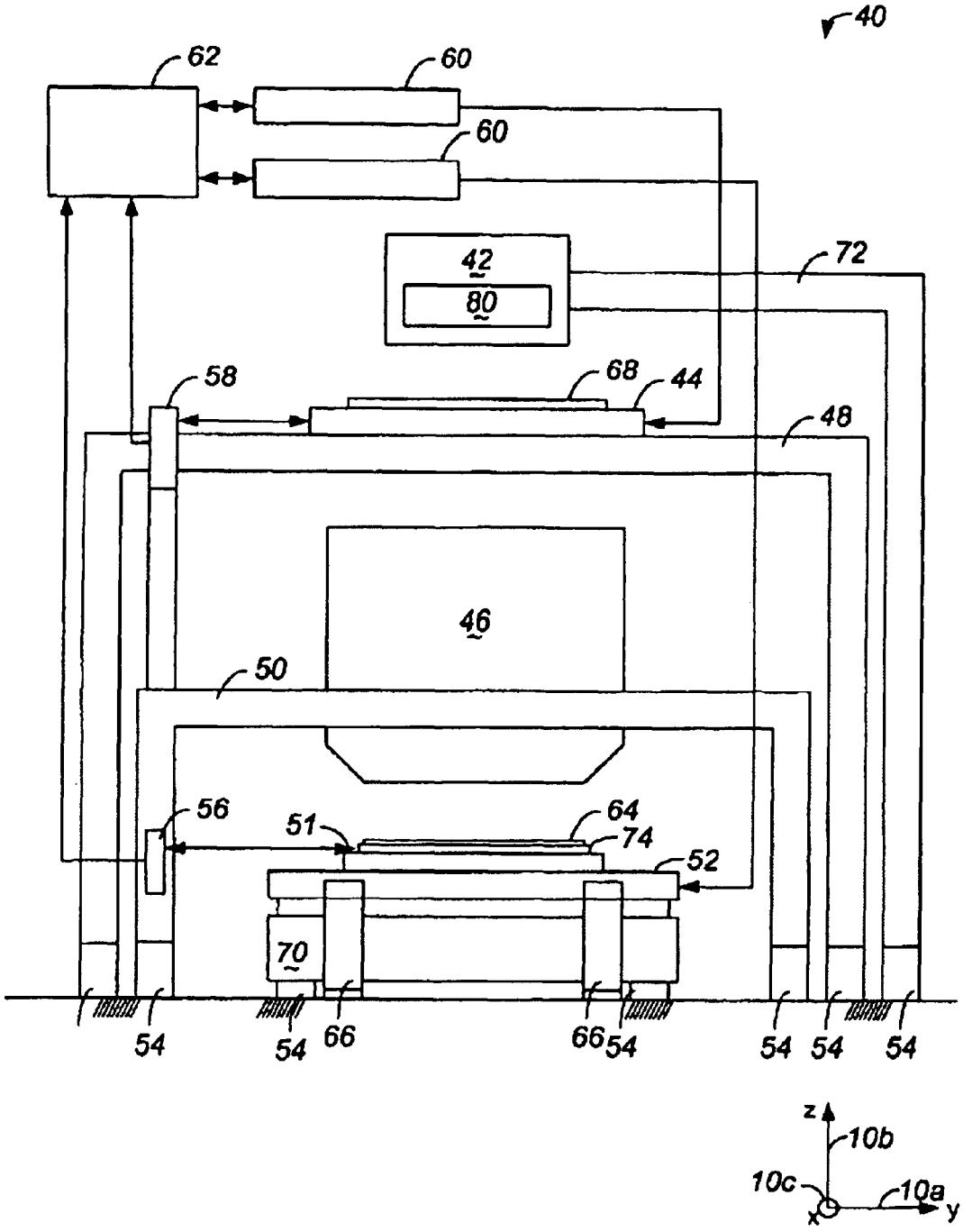
FIG. 11 is a diagrammatic representation of a photolithography apparatus in accordance with an embodiment of the present invention.

With reference to FIG. 11, a photolithography apparatus which may include an enhanced illuminator, i.e., an illuminator which uses an illuminator aperture which combines features of a small sigma illuminator aperture with features of an off-axis illuminator aperture, will be described in accordance with an embodiment of the present invention. A photolithography or exposure apparatus 40 includes a wafer positioning stage 52 that may be driven by a planar motor (not shown), as well as a wafer table 51 that is magnetically coupled to wafer positioning stage 52 by utilizing an actuator such as an EI-core actuator, e.g., an EI-core actuator with a top coil and a bottom coil which are substantially independently controlled. The planar motor which drives wafer positioning stage 52 generally uses an electromagnetic force generated by magnets and corresponding armature coils arranged in two dimensions. A wafer 64 is held in place on a wafer holder or chuck 74 which is coupled to wafer table 51. Wafer positioning stage 52 is arranged to move in multiple degrees of freedom, e.g., between three to six degrees of freedom, under the control of a control unit 60 and a system controller 62. The movement of wafer positioning stage 52 allows wafer 64 to be positioned at a desired position and orientation relative to a projection optical system 46.

Wafer table 51 may be levitated in a z-direction 106 by any number of voice coil motors (not shown), e.g., three voice coil motors, which are effectively an array of motors. The motor array of wafer positioning stage 52 is typically supported by a base 70. Base 70 is generally supported to a ground via isolators 54. Reaction forces generated by motion of wafer stage 52 may be mechanically released to a ground surface through a frame 66.

An illumination system 42, which includes an enhanced illuminator aperture 80, is supported by a frame 72. Frame 72 is supported to the ground via isolators 54. Illumination system 42 includes an illumination source (not shown), and is arranged to project a radiant energy, e.g., light, through illuminator aperture 80 to a mask pattern on a reticle 68 that is supported by and scanned using a reticle stage assembly 44 which may include a coarse stage and a fine stage. At least some of the radiant energy passes through reticle 68, and is focused through projection optical system 46, which is supported on a projection optics frame 50 and may be supported the ground through isolators 54. Isolators 54 may be part of an overall active vibration isolation system (AVIS).

A first interferometer 56 is supported on projection optics frame 50, and functions to detect the position of wafer table 51. Interferometer 56 outputs information on the position of wafer table 51 to system controller 62. A second interferometer 58 is supported on projection optical system 46, and detects the position of at least a part of reticle stage assembly 44 which supports a reticle 68. Interferometer 58 also outputs position information to system controller 62.

It should be appreciated that there are a number of different types of photolithographic apparatuses or devices. For example, photolithography apparatus 40 may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly associated with projection optical system 46 or illumination system 42 by reticle stage assembly 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a stepping type, or a step-and-repeat type, photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimcr laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultraviolet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum. In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, systems which include a reflecting optical device and incorporates a concave mirror, or a concave mirror in addition to a beam splitter.

Further, in photolithography systems or projection tools, when linear motors are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above. Additionally, reaction forces generated by the reticle (mask) stage motion may be mechanically released to the floor (ground) by use of a frame member.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Although only a few embodiments of the present invention have been described, it should be understood that the present invention may be embodied in many other specific forms without departing from the spirit or the scope of the present invention. By way of example, an illuminator aperture which is effectively a combination of a small sigma, on-axis illuminator aperture and an off-axis illuminator aperture has been described as having either three poles or five poles. The number of poles, however, may vary widely. That is, the number of poles in an illuminator aperture is not limited to being either three or five.

The configuration of poles in an illuminator aperture may be widely varied. The areas of each pole relative to other poles may vary and the location of poles may vary. In addition, the shape of each pole may vary. For example, while a 3-pole illuminator aperture has been described as having an on-axis pole that has a greater area than each off-axis pole, each of the poles may have substantially the same area. The off-axis poles may also be substantially triangular or rectangular in shape, i.e., the off-axis poles are not necessarily circular in shape.

The outer poles of an illuminator aperture may be arranged such that an outer edge of each pole substantially coincides with the outer edge of the illuminator aperture, as discussed above. In some embodiments, however, the outer edge of each outer pole is not necessarily coincident with the outer edge of the illuminator aperture.

The size of outer poles of an illuminator aperture have generally been described as each either having approximately the same area as a center pole, or having a smaller area than the than the center pole. The size of the outer poles, in one embodiment, may be such that each outer pole has a larger area than the center pole.

While the outer poles of an illuminator aperture have been described as having substantially the same size and shape, as well as the same sigma ($\sigma$), it should be appreciated that the outer poles are not necessarily uniform. That is, each outer pole of an illuminator aperture may have a different area or shape. The choice of an appropriate are or shape for each outer pole may be based upon the requirements of a particular system without departing from the spirit or the scope of the present invention. Therefore, the present examples are to be considered as illustrative and not restrictive, and the invention is not to be limited to the details given herein, but may be modified within the scope of the appended claims.

What is claimed is:

1. An illumination system, the illumination system being suitable for use as a part of a projection tool, the illumination system comprising:

an illumination source; and an illuminator aperture, the illuminator aperture having a center point and an outer edge, the illuminator aperture including a first pole that is defined substantially about the center point and a second pole, the second pole being defined substantially between the first pole and the outer edge, the first pole having a first sigma and the second pole having a second sigma, the first sigma being at least [aproximately] *approximately* as large as the second sigma, wherein the illumination source is arranged to provide a beam to the illuminator aperture.

2. The illumination system of claim 1 wherein the first pole has a first area and the second pole has a second area, the second area being substantially equal to the first area.

3. The illumination system of claim 1 wherein the first pole has a first area and the second pole has a second area, the second area being smaller than the first area.

[4. The illumination system of claim 1 wherein the first pole has a first area and the second pole has a second area, the second area being larger than the first area.]

5. The illumination system of claim 1 wherein the illuminator aperture further includes a third pole, the third pole being defined substantially between the first pole and the outer edge, wherein the second pole has a second area and the third pole has a third area, the third area being substantially equal to the second area.

6. An illumination system, the illumination system being suitable for use as a part of a projection tool, the illumination system comprising:

an illumination source: and an illuminator aperture, the illuminator aperture having a center point and an outer edge, the illuminator aperture including a first pole that is defined substantially about the center point, a second pole, and a third pole, the second pole being defined substantially between the first pole and the outer edge and the third pole being defined substantially between the first pole and the outer edge, the illumination source being arranged to provide a beam to the illuminator aperture, wherein the first pole has a first area, the second pole has a second area, and the third pole has a third area, the third area being substantially equal to the second area, the first area being substantially equal to a sum of the second area and the third area.

7. The illumination system of claim 1 wherein the second pole has an edge, the edge of the second pole being substantially coincident with the outer edge of the illuminator aperture.

8. The illumination system of claim 1 wherein the first sigma is approximately the same as the second sigma.

9. The illumination system of claim 1 wherein (he first sigma is greater than the second sigma.

10. An illuminator aperture, the illuminator aperture being suitable for use as a component of an illumination system that is a part of a projection tool, the illuminator aperture comprising:

a center pole, the center pole having an associated center pole sigma and being defined about a center point of the illuminator aperture; and a plurality of outer poles, wherein each outer pole of the plurality of outer poles is defined substantially between the center pole and an outer edge of the illuminator aperture, wherein each outer pole of the plurality of outer poles has an outer pole sigma, the center pole sigma being at least [aproximately] *approximately* equal to the outer pole sigma.

11. The illuminator aperture of claim 10 wherein the center pole has a first area and each outer pole of the plurality of outer poles has a second area, the first area being substantially the same as the second area.

12. An illuminator aperture the illuminator aperture being suitable for use as a component of an illumination system that is a part of a projection tool, the illuminator aperture comprising:

a center pole, the center pole being defined about a center point of the illuminator aperture; and a plurality of outer poles, wherein each outer pole of the plurality of outer poles is defined substantially between the center pole and an outer edge of the illuminator aperture, wherein the center pole has a first area and each outer pole of the plurality of outer poles has a second area, the first area being approximately equal to a sum of the second areas for each pole of the plurality of outer poles.

13. The illuminator aperture of claim 10 wherein each outer pole of the plurality of outer poles has an edge, the edge of each outer pole of the plurality of outer poles being arranged to substantially coincide with the outer edge of the illuminator aperture.

14. The illuminator aperture of claim 10 wherein the plurality of outer poles includes two outer poles.

15. The illuminator aperture of claim 10 wherein the plurality of outer poles includes four outer poles.

16. A photolithography apparatus comprising:

an object;

a reticle, the reticle having a plurality of patterns that is arranged to be patterned on the object; and an illuminator, the illuminator including an illumination source and an illuminator aperture, the illumination source being arranged to project a beam through the illuminator aperture to the reticle, wherein the illuminator aperture has a layout that includes an on-axis element and at least one off-axis element, wherein the on-axis element has an associated sigma that is at least approximately equal to an associated sigma of the at least one off-axis element.

17. The photolithography apparatus of claim 16 wherein the plurality of patterns includes isolated patterns and dense patterns, the layout of the illuminator aperture being arranged to accurately pattern the isolated patterns and the dense patterns onto the object.

18. The photolithography apparatus of claim 16 wherein the at least one off-axis element has a first edge that coincides with an outer edge of the illuminator aperture.

19. The photolithography apparatus of claim 16 wherein the at least one off-axis element has a first area and the on-axis element has a second area, the first area being approximately equal to the second area.

20. The photolithography apparatus of claim 16 wherein the at least one off-axis element has a first area and the on-axis element has a second area, the first area being less than the second area.

21. The photolithography apparatus of claim 16 wherein the at least one off-axis element is an outer pole and the on-axis element is a center pole.

22. A method for using a photolithography apparatus, the photolithography apparatus including an illuminator, a reticle, and an object to be patterned, the method comprising:

providing a beam from a source associated with the illuminator to an illuminator aperture associated with the illuminator, the illuminator aperture having a small sigma, on-axis element and at least one off-axis element, wherein the at least one off-axis element has an outer edge that is substantially coincident to an outer edge of the illuminator aperture and that is not coincident with an outer edge of the small sigma, on-axis element;

passing the beam through the illuminator aperture to the reticle, wherein the reticle includes a dense pattern and an isolated pattern; and patterning the dense pattern and the isolated pattern onto the object.

23. The illumination system of claim 1 wherein the second pole has an outer edge, the outer edge of the second pole being substantially coincident with the outer edge of the illuminator and not coincident with the outer edge of the first pole.

24. An illumination system, the illumination system being suitable for use as a part of a projection tool, the illumination system comprising:

an illumination source; and an illuminator aperture, the illuminator aperture having a center point and an outer edge, the illuminator aperture including a first pole that is defined substantially about the center point and a second pole, the second pole having a second pole edge and being defined substantially between the first pole and the outer edge, the second pole edge being substantially coincident with the outer pole edge and not coincident with the first pole, wherein the illumination source is arranged to provide a beam to the illuminator aperture.

25. An illuminator aperture, the illuminator aperture being suitable for use as a component of an illumination system that is a part of a projection tool, the illuminator aperture comprising;

a center pole, the center pole having a center pole outer edge and being defined about a center point of the illuminator aperture; and a plurality of outer poles, wherein each outer pole of the plurality of outer poles has an outer pole edge and is defined substantially between the center pole and an outer edge of the illuminator aperture, wherein each outer pole edge is substantially coincident with the outer edge of the illuminator aperture and is not coincident with the center pole outer edge.

*26. An apparatus comprising:*

*a first holding element to hold a patterning element;*

*a second holding element to hold a substrate;*

*an illumination source configured to illuminate both dense and sparse features of the patterning element onto the substrate; and*

*an illuminator optical element positioned between the illumination source and the substrate, the illuminator optical element being configured to control illumination source intensity distribution between the dense features and the sparse features on the patterning element by a first pole having a first sigma and a second pole having a second sigma, the first sigma being at least approximately as large as the second sigma.*

*27. The apparatus of claim 26, wherein the first pole is an on-axis pole for patterning the imaging of the sparse features defined by the patterning element onto the substrate.*

*28. The apparatus of claim 27, wherein the on-axis pole controls the illumination power from the illumination source to be delivered to the patterning element for the imaging of the sparse features onto the substrate.*

*29. The apparatus of claim 26, wherein the second pole is one or more off-axis poles for patterning the imaging of the dense features defined by the patterning element on the substrate respectively.*

*30. The apparatus of claim 29, wherein the one or more off-axis pole controls the illumination power from the illumination source to be delivered to the patterning element for the imaging of the dense features onto the substrate.*

*31. The apparatus of claim 26, wherein the illuminator optical element is a five pole illuminator optical element wherein the first pole is an on-axis pole and the second pole includes four off-axis poles.*

*32. The apparatus of claim 31, wherein the illuminator optical element is configured to control the illumination source intensity between the dense features and the sparse features on the patterning element by providing substantially a same illumination source intensity between the on-axis pole and a sum of the four off-axis poles respectively.*

*33. The apparatus of claim 31, wherein the illuminator optical element is configured to control the illumination source intensity between the dense features and the sparse features on the patterning element by providing more illumination source intensity to the on-axis pole relative to a sum of the illumination intensity provided to the four off-axis poles.*

*34. The apparatus of claim 26, wherein the illuminator optical element is a three-pole illuminator optical element wherein the first pole is an on-axis pole and the second pole includes two off-axis poles.*

*35. The apparatus of claim 34, wherein the illuminator optical element is configured to control the illumination source intensity between the dense features and the sparse features on the patterning element by providing substantially a same illumination source intensity provided to the on-axis pole as provided to the two off-axis poles, respectively.*

*36. The apparatus of claim 34, wherein the illuminator optical element is configured to control the illumination source intensity between the dense features and the sparse features on the patterning element by providing more illumination source intensity to the on-axis pole relative to the illumination intensity provided to the two off-axis poles.*

*37. The apparatus of claim 26, wherein the illuminator optical element includes an on axis layout configured to deliver the illumination source intensity to the sparse features and an off axis layout configured to deliver the illumination source intensity to the dense features respectively.*

*38. The apparatus of claim 37, wherein the on axis layout has an area that is equal to or greater than an area of the sum of the off axis layout.*

*39. The apparatus of claim 26, wherein the illuminator optical element is an illuminator aperture.*

*40. The apparatus of claim 26, wherein the illumination source consists of one of the following types of illumination sources:*

*a. g-line illumination source;*

*b. KrF excimer laser;*

*c. ArF excimer laser;*

*d. F2 type laser; or*

*e. a charged particle beam illumination source.*

*41. The apparatus of claim 26, wherein the patterning element is a reticle.*

*42. The apparatus of claim 26, further comprising an illuminator, the illuminator including the illumination source, the illuminator optical element, and a condenser lens.*

*43. The apparatus of claim 26, further comprising a lens assembly configured to project the pattern defined by the patterning element and illuminated by the illumination source onto the substrate.*

*44. The apparatus of claim 26, wherein the illuminator optical element is a mask.*

*45. The apparatus of claim 26, wherein the illuminator optical element is an illuminator.*

*46. The apparatus of claim 26, wherein the illuminator optical element controls the illumination source intensity distribution between the dense features and the sparse features on the patterning element by delivering greater than or equal illumination intensity to the sparse features than illumination intensities to the dense features.*

*47. The apparatus of claim 26, wherein the first pole is a small sigma, on axis layout and the second pole is an off axis layout.*

*48. The apparatus of claim 26, wherein the first sigma and the second sigma are characterized such that the intensity distribution being delivered to the first pole characterized by the first sigma is at least equal to the intensity distribution delivered to the second pole characterized by the second sigma.*

*49. An apparatus comprising:*

*an illuminator mask configured to pattern both dense feature geometries and isolated feature geometries of a patterning element by delivering illumination intensity for the sparse feature geometries that is greater than or equal to illumination intensities for the dense feature geometries, wherein the mask has a first pole having a first sigma and a second pole having a second sigma, the first sigma being at least approximately as large as the second sigma.*

*50. The apparatus of claim 49, wherein the mask includes an on axis layout configured to deliver the illumination intensity to the sparse feature geometries and an off axis layout configured to deliver the illumination intensities to the dense feature geometries.*

*51. The apparatus of claim 50, wherein the on axis layout has an area that is equal to or greater than an area of the sum of the off axis layout, the area of the on axis layout configured to deliver the illumination intensity to the sparse feature geometries and a sum of the area of the off axis layout configured to deliver the illumination intensities to the dense feature geometries.*

*52. The apparatus of claim 49, wherein the mask is an optical element.*

*53. The apparatus of claim 50, wherein:*

*the on-axis layout is configured to pattern images of the isolated feature geometries, defined by the patterning element, onto a substrate; and*

*the off-axis layout is configured to pattern images of the dense feature geometries defined by the patterning element on the substrate.*

*54. The apparatus of claim 49, wherein the mask is an illumination aperture having both an on-axis layout and an off-axis layout.*

*55. The apparatus of claim 49, wherein the mask is positioned between an illumination source and the patterning element, the illumination source configured to illuminate the patterning element.*

*56. The apparatus of claim 49, wherein the patterning element is a reticle.*

*57. The apparatus of claim 49, wherein the mask is a single mask.*

*58. The apparatus of claim 49, wherein the mask is a five pole optical element defining one on-axis pole and four off-axis poles.*

*59. The apparatus of claim 49, wherein the mask is a three pole optical element defining one on-axis pole and two off-axis poles.*

*60. The apparatus of claim 49, wherein the illumination source comprises an illumination sources which is one of:*

*a. g-line illumination source;*

*b. KrF excimer laser;*

*c. ArF excimer laser;*

*d. F2 type laser; and*

*e. a charged particle beam illumination source.*

*61. The apparatus of claim 49, wherein the mask is an optical element configured to control an illumination source intensity between the dense feature geometries and the isolated feature geometries on the patterning element by providing substantially a same illumination source intensity between an on-axis pole and a sum of off-axis poles of the mask.*

*62. The apparatus of claim 49, wherein the mask is an optical element configured to control the illumination source intensity between the dense feature geometries and the isolated feature geometries on the patterning element by providing more illumination source intensity to the on-axis pole relative to a sum of the illumination intensity provided to off-axis poles of the mask.*

*63. The apparatus of claim 49, further comprising a lens assembly configured to project the pattern defined by the patterning element and illuminated by the illumination source onto a substrate.*

*64. An apparatus comprising an optical element having elements comprising an on axis layout and an off axis layout to control illumination source intensity distribution of both dense and sparse features on a patterning element, the on axis layout being configured to deliver illumination intensity that is greater than or equal to illumination intensities associated with the off axis layout, the optical element including a first pole having a first sigma and a second pole having a second sigma, the first sigma being at least approximately as large as the second sigma.*

*65. The apparatus of claim 64, further comprising:*

*the patterning element which defines a pattern having both the dense and sparse features; and*

*an illumination source configured to illuminate both the dense and sparse features of the patterning element onto a substrate through the optical element, positioned between the patterning element and the illumination source.*

*66. The apparatus of claim 65, wherein the on-axis layout and the off-axis layout controls illumination power from the illumination source to be delivered to the patterning element for the imaging of the sparse features onto the substrate and the dense features onto the substrate, respectively.*

*67. The apparatus of claim 65, wherein the optical element is an illuminator aperture.*

*68. The apparatus of claim 65, wherein the illumination source consists of one of the following types of illumination sources:*

*a. g-line illumination source;*

*b. KrF excimer laser;*

*c. ArF excimer laser;*

*d. F2 type laser; or*

*e. a charged particle beam illumination source.*

*69. The apparatus of claim 64, wherein the optical element is a mask.*

*70. The apparatus of claim 69, wherein the illumination intensity is at the mask.*

* * * * *

UNITED STATES PATENT AND TRADEMARK OFFICE

CERTIFICATE OF CORRECTION

PATENT NO. : RE41,681 E
APPLICATION NO. : 11/432797
DATED : September 14, 2010
INVENTOR(S) : Jacek K. Tyminski It is certified that error appears in the above-identified patent and that said Letters Patent is hereby corrected as shown below:

At column 13, line 56 (claim 9) of the printed patent, "(he" should be --the--.

Signed and Sealed this
Eleventh Day of January, 2011

David J. Kappos

David J. Kappos
*Director of the United States Patent and Trademark Office*